United States Patent
Eimitsu

(10) Patent No.: US 10,389,367 B2
(45) Date of Patent: Aug. 20, 2019

(54) SEMICONDUCTOR CIRCUIT

(71) Applicant: TOSHIBA MEMORY CORPORATION, Minato-ku, Tokyo (JP)

(72) Inventor: Masatomo Eimitsu, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/905,534

(22) Filed: Feb. 26, 2018

(65) Prior Publication Data

US 2019/0068202 A1 Feb. 28, 2019

(30) Foreign Application Priority Data

Aug. 30, 2017 (JP) .................................. 2017-165864

(51) Int. Cl.
*H03L 7/085* (2006.01)
*G06F 13/42* (2006.01)
*H03L 7/08* (2006.01)

(52) U.S. Cl.
CPC .......... *H03L 7/085* (2013.01); *G06F 13/4295* (2013.01); *H03L 7/0802* (2013.01); *G06F 2213/0026* (2013.01)

(58) Field of Classification Search
CPC .................................. H03K 3/35; H03L 7/085
See application file for complete search history.

(56) References Cited

U.S. PATENT DOCUMENTS

| | | | | |
|---|---|---|---|---|
| 5,621,485 A | * | 4/1997 | Terao | ...................... H03L 7/085 348/536 |
| 6,529,456 B2 | * | 3/2003 | Koudo | ................. G11B 19/247 369/47.36 |
| 6,917,232 B2 | * | 7/2005 | Wyatt | ...................... G06F 1/06 327/238 |
| 7,633,965 B2 | | 12/2009 | Shibata et al. | |
| 8,593,313 B2 | | 11/2013 | Koyanagi | |

FOREIGN PATENT DOCUMENTS

| | | |
|---|---|---|
| JP | 2012-151617 A | 8/2012 |
| JP | 5610540 B2 | 10/2014 |

* cited by examiner

*Primary Examiner* — Hai L Nguyen
(74) *Attorney, Agent, or Firm* — Foley & Lardner LLP

(57) ABSTRACT

A semiconductor circuit includes a plurality of transmitting circuits, each of which receives a corresponding one of synchronized first clock signals input thereto and includes a first circuit outputting a third clock signal which is generated by dividing the frequency of an unsynchronized second clock signal and is synchronized with the first clock signal, a phase comparator comparing phases of the first clock signal and the third clock signal, and a reset signal generator setting, if a phase shift is detected by the phase comparator, the first signal at a first logic level for a predetermined period. The first circuit enters a reset state during a period in which the first signal is at the first logic level, and, when the first signal changes from the first logic level to a second logic level, is released from a reset state and generates the third clock signal synchronized with the first clock signal.

20 Claims, 5 Drawing Sheets

SEMICONDUCTOR CIRCUIT

This application claims the benefit of and priority to Japanese Patent Application No. 2017-165864, filed Aug. 30, 2017, the entire contents of which are incorporated herein by reference.

FIELD

Embodiments described herein relate generally to semiconductor circuits.

BACKGROUND

One of signal transmission interfaces between two circuits is a signal transmission interface called PCI Express® (hereinafter, PCIe). PCIe has gone through several generations of evolution, and, with each succeeding generation, the transmission speed increases. A finer process is needed to increase the transmission speed, which makes a soft error more likely to occur.

PCIe is originally a signal transmission interface that performs serial data transmission, but PCIe can also transmit parallel data, which is a bundle of a plurality of pieces of serial data, by synchronizing the parallel data. In fourth-generation PCIe Gen4, transmission of parallel data is made possible by providing a frequency division circuit for each serial data of PCIe and synchronizing the frequency division circuits.

DETAILED DESCRIPTION

Although transmission of parallel data is possible in the fourth-generation PCIe Gen4, there may be a possibility that some frequency division circuits of the serial data lose synchronization due to some unexpected factors such as a soft error. If the frequency division circuits lose synchronization, parallel data transmission that meets specifications set in the PCIe standards cannot be performed.

An exemplary embodiment provides a semiconductor circuit that can improve reliability of data transmission by promptly performing resynchronization even when synchronization is lost by some factors.

In general, according to some embodiments, a semiconductor circuit including a plurality of transmitting circuits, each of which receives a corresponding one of synchronized first clock signals input thereto, is provided. In some embodiments, each of the plurality of transmitting circuits includes a frequency division circuit that outputs a third clock signal which is generated by dividing the frequency of an unsynchronized second clock signal and is synchronized with the first clock signal, a phase comparator that compares the phases of the first clock signal and the third clock signal, and a reset signal generator that sets, if a phase shift is detected by the phase comparator, the first signal at a first logic level for a predetermined period. In some embodiments, the frequency division circuit enters a reset state during a period in which the first signal is at the first logic level, and then, when the first signal changes from the first logic level to a second logic level, the frequency division circuit is released from a reset state and generates again the third clock signal synchronized with the first clock signal.

Hereinafter, embodiments will be described with reference to the drawings. It is to be noted that, in the present disclosure and attached drawings, some components are omitted, changed, or simplified in the description and illustration to facilitate understanding and for the sake of illustration, but the technical contents that may be capable of achieving similar functions are also construed as being included in the present disclosure.

Figure 1:
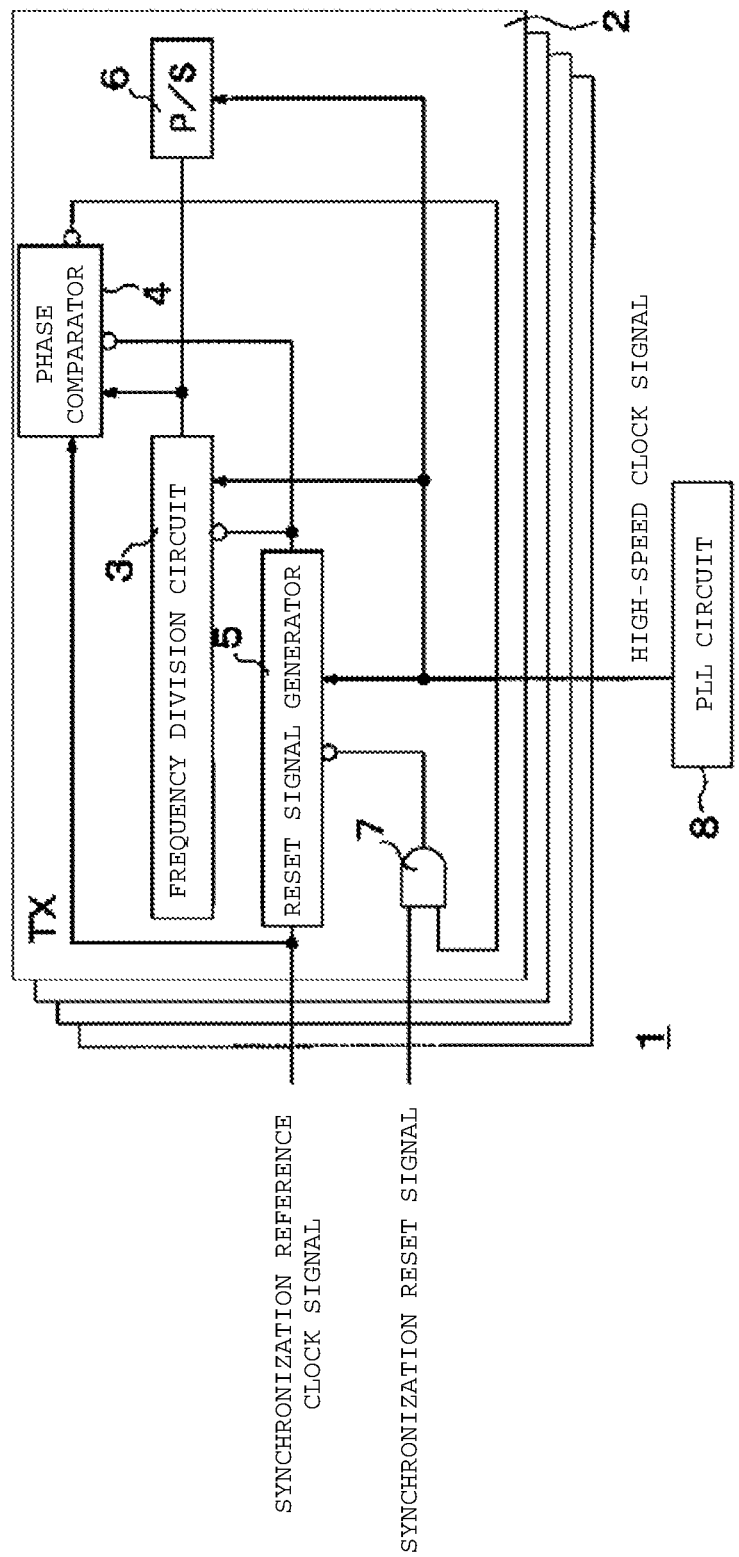
FIG. 1 is a block diagram depicting a schematic configuration of a semiconductor circuit according to a first embodiment.

FIG. 1 is a block diagram depicting the schematic configuration of a semiconductor circuit 1 according to a first embodiment. In some embodiments, the semiconductor circuit 1 has a serial interface function of PCIe. The semiconductor circuit 1 may include a transmitting circuit (TX) 2 or a plurality of transmitting circuits (TX) 2. In FIG. 1, four transmitting circuits 2 are depicted, but the number of transmitting circuits 2 is not limited to a particular number. The transmitting circuits 2 are also called lanes. In some embodiments, the transmitting circuits 2 can transmit parallel data by synchronizing the parallel data in units of, for example, 1, 2, 4, 8, or 16 transmitting circuits. When the plurality of transmitting circuits 2 transmit parallel data, the transmitting circuits 2 may synchronize serial data which is output from the transmitting circuits 2. Therefore, a frequency division circuit 3 may be provided in each of the transmitting circuits 2 so that frequency-division clock signals (third clock signals) which are generated by the frequency division circuits 3 are synchronized with each other.

In some embodiments, a frequency-division clock signal generated by one frequency division circuit 3 is distributed to the plurality of transmitting circuits 2. In some embodiments, if, for example, two transmitting circuits 2 transmit first parallel data and the other two transmitting circuits 2 transmit second parallel data, a frequency-division clock signal for the first parallel data and a frequency-division clock signal for the second parallel data do not necessarily have to be synchronized with each other. In some embodiments, frequency division circuits are provided individually in the transmitting circuits 2 so that the frequency division circuits in an arbitrary number of lanes can be synchronized with each other.

In some embodiments, when bidirectional signal transmission is performed, a receiving circuit is provided in addition to the transmitting circuits 2. In some embodiments, in the semiconductor circuit 1, various circuits other than the transmitting circuit 2 may be implemented.

In some embodiments, synchronized synchronization reference clock signals (first clock signals; see FIG. 3) and synchronized synchronization reset signals (second signals; see FIG. 3) are input to the transmitting circuits 2. In some embodiments, the synchronization reference clock signals and the synchronization reset signals may be supplied from a controller (not shown). A generation source of the synchronization reference clock signals and a generation source of the synchronization reset signals may be different from each other. In addition to these signals, a high-speed clock signal (a second clock signal) generated by a PLL (phase-locked loop) circuit 8 may be input to each transmitting circuit 2. The high-speed clock signal can be generated by a single PLL circuit 8. In some embodiments, a plurality of PLL circuits 8 are provided individually for the transmitting circuits 2 and these PLL circuits 8 are synchronized with each other. In some embodiments, the high-speed clock signal is not synchronized with the synchronization reference clock signal and the synchronization reset signal.

In some embodiments, each transmitting circuit 2 includes the frequency division circuit 3, a phase comparator 4, a reset signal generator 5, and a parallel-serial converter (P/S) 6. The frequency division circuits 3 of the plurality of transmitting circuits 2 may generate synchronized frequency-division clock signals (see FIG. 3) by using the high-speed clock signal. By synchronizing the frequency-division clock signals of the plurality of transmitting circuits 2, parallel data, which is a bundle of pieces of serial data output from the plurality of transmitting circuits 2, can be transmitted.

In some embodiments, the frequency division circuit 3 generates the frequency-division clock signal that is synchronized with the synchronization reference clock signal by dividing the frequency of the high-speed clock signal. The frequency division circuit 3 may generate a plurality of frequency-division clock signals generated at different frequency division ratios. In some embodiments, a signal designating a frequency division ratio may be input to the frequency division circuit 3 and a frequency-division clock signal generated at a frequency division ratio in accordance with the signal may be output from the frequency division circuit 3.

In some embodiments, the phase comparator 4 compares the phases of the synchronization reference clock signal and the frequency-division clock signal. More specifically, the phase comparator 4 may output a signal indicating whether or not a phase difference between the synchronization reference clock signal and the frequency-division clock signal is a previously set value. Based on the logic level of the signal which is output from the phase comparator 4, it is possible to detect whether or not the phases of the synchronization reference clock signal and the frequency-division clock signal are shifted.

In some embodiments, if a phase shift is detected by the phase comparator 4, the reset signal generator 5 may set a reset signal (a first signal) at a first logic level (for example, a low level) for a predetermined period. This reset signal can be used to make the frequency division circuit 3 and the phase comparator 4 enter a reset state. Thus, in response to receiving the reset signal set by the reset signal generator 5, the frequency division circuit 3 and the phase comparator 4 may enter the reset state. More specifically, during a period in which the reset signal is at the first logic level, the frequency division circuit 3 and the phase comparator 4 may be in a reset state. The output values of the frequency division circuit 3 and the phase comparator 4 may be at their respective fixed logic levels during a period in which the frequency division circuit 3 and the phase comparator 4 are in the reset state.

In some embodiments, the reset signal generator 5 is provided with a reset terminal, and, to this reset terminal, an output signal of an AND gate 7 is input. The AND gate 7 may perform a logical AND operation to compute an AND value of the synchronization reset signal and an output signal of the phase comparator 4. If the output signal of the AND gate 7 (indicating the AND value of the synchronization reset signal and the output signal of the phase comparator 4) is LOW, for example, the reset signal generator 5 may enter a reset state and the reset signal which is output from the reset signal generator 5 may become the first logic level. The output signal of the AND gate 7 becomes LOW either when the synchronization reset signal is at a low level or when the output signal of the phase comparator 4 is at a low level or when both the synchronization reset signal and the output signal of the phase comparator 4 are at a low level. The output signal of the phase comparator 4 may become a low level when the phases of the synchronization reference clock signal and the frequency-division clock signal are shifted.

In some embodiments, the frequency division circuit 3 enters a reset state during a period in which the reset signal which is output from the reset signal generator 5 is at the first logic level, and then, when the reset signal changes from the first logic level to a second logic level, reset is lifted, and the frequency division circuit 3 generates again the frequency-division clock signal that is synchronized with the synchronization reference clock signal.

In some embodiments, the frequency-division clock signal generated by the frequency division circuit 3 is input to the P/S 6, for example, and is used for converting parallel data into serial data. In response to receiving the frequency-division clock signal generated by the frequency division circuit 3, the P/S 6 may convert parallel data into serial data. The P/S 6 may convert parallel data into serial data in synchronism with the frequency-division clock signal.

In some embodiments, the P/S 6 in the semiconductor circuit 1 is not provided, and the frequency-division clock signal generated by the frequency division circuit 3 may be used by various circuit parts other than the P/S 6.

Figure 2:
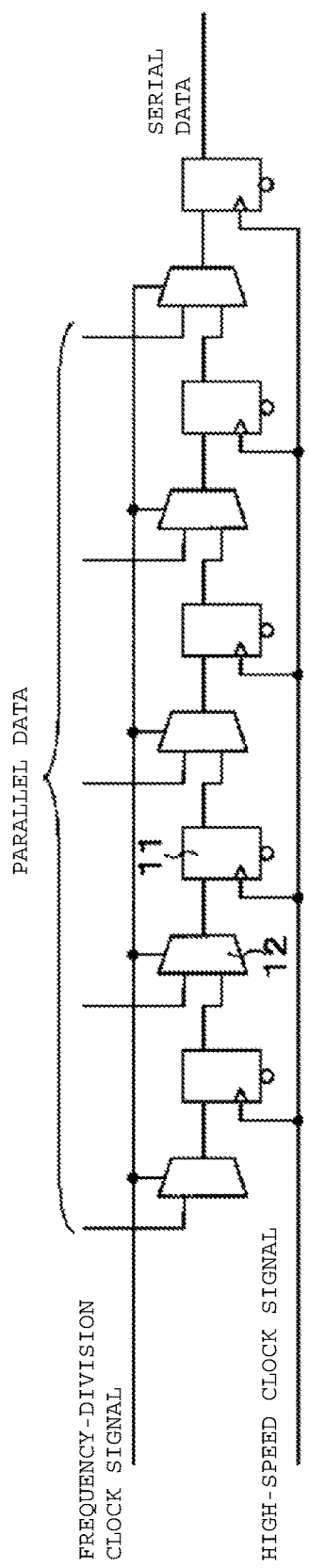
FIG. 2 is a circuit diagram depicting an internal configuration of a P/S according to some embodiments.

FIG. 2 is a circuit diagram depicting the internal configuration of the P/S 6 according to some embodiments. In some embodiments, the P/S 6 includes a plurality of F/Fs (flip-flops) 11 and a plurality of multiplexers 12 connected to data input terminals of the F/Fs 11. In accordance with the logic level of the frequency-division clock signal, each of the plurality of multiplexers 12 may select an output of the F/F 11 in the previous stage (e.g., the F/F on the left side of the multiplexer in the current stage) or parallel data from the outside. Each F/F 11 may take in data at the data input terminal of the F/F 11 in synchronism with the high-speed clock signal. For instance, when the frequency-division clock signal is HIGH, each multiplexer 12 may select parallel data, and then, the selected parallel data may be converted into serial data and sequentially output in synchronism with the high-speed clock signal. The internal configuration of the P/S 6 is not limited to the internal configuration depicted in FIG. 2.

Figure 3:
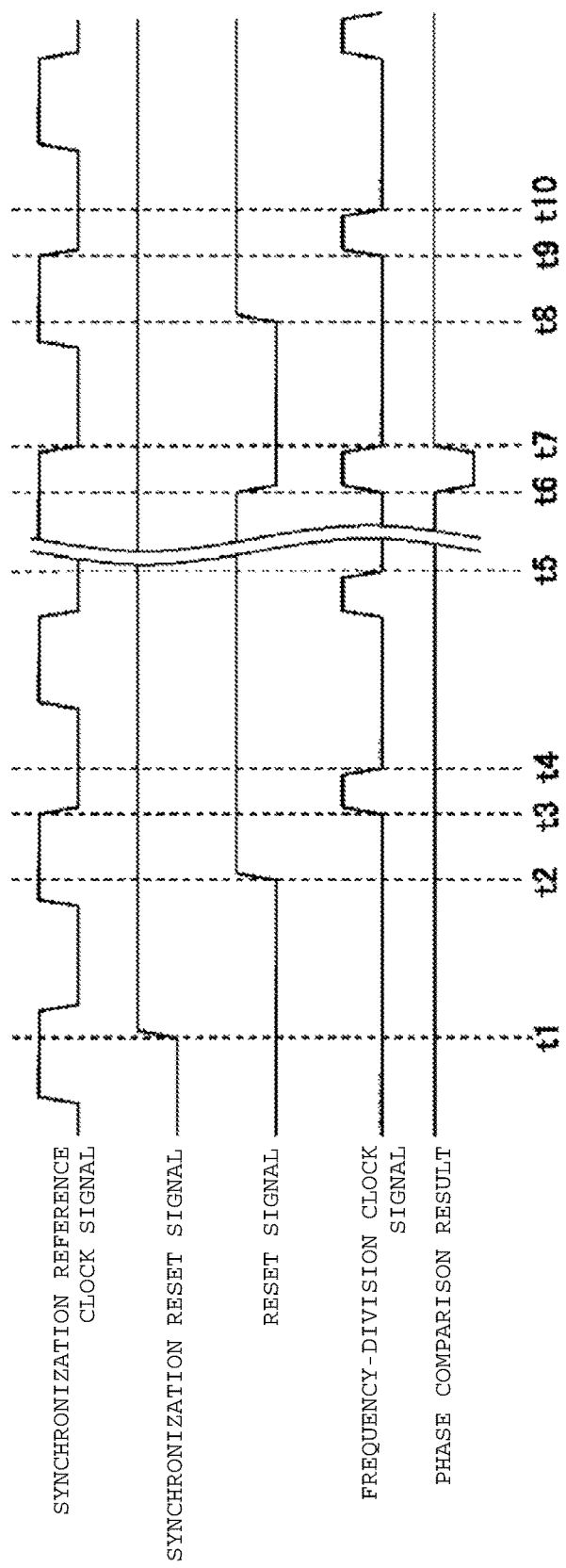
FIG. 3 is an operation timing diagram of each transmitting circuit of FIG. 1 according to some embodiments.

FIG. 3 is an operation timing diagram of each transmitting circuit 2 of FIG. 1 according to some embodiments. Referring to FIG. 3, a period from time t3 to t5 and after time t9 of FIG. 3 illustrates an example period in which the synchronization reference clock signal and the frequency-division clock signal are synchronized with each other. A period from time t6 to t7 of FIG. 3 illustrates an example period in which the synchronization reference clock signal and the frequency-division clock signal lose synchronization.

In some embodiments, as shown in FIG. 3, until time t1, the synchronization reset signal is LOW and the reset signal generator 5 sets the reset signal at the first logic level (low level) for a predetermined period (t1 to t2). As a result, the frequency division circuit 3 and the phase comparator 4 enter a reset state for the predetermined period (t1 to t2).

In some embodiments, at time t2, the reset signal generator 5 sets the reset signal at the second logic level (high level). As a result, the frequency division circuit 3 is released from a reset state. Then, at time t3, the frequency division circuit 3 generates a HIGH pulse of the frequency-division clock signal during time t3 to t4 in synchronism with timing of a change of the synchronization reference clock signal from HIGH to LOW. After that time, the frequency division circuit 3 generates the frequency-division clock signal of a predetermined frequency until the frequency division circuit 3 enters a reset state again. The frequency-division clock signals are synchronized with each other in the plurality of transmitting circuits 2.

In some embodiments, the phase comparator 4 determines that the phases of the synchronization reference clock signal and the frequency-division clock signal match with each other if the synchronization reference clock signal is HIGH and the frequency-division clock signal is LOW at the same time (e.g., time t2 to t3) or if the synchronization reference clock signal is LOW and the frequency-division clock signal is LOW at the same time (e.g., after time t4 or after time t7) or if the synchronization reference clock signal is LOW and the frequency-division clock signal is HIGH at the same time (e.g., time t3 to t4). On the other hand, the phase comparator 4 determines that the phases of the synchronization reference clock signal and the frequency-division clock signal are shifted if the synchronization reference clock signal is HIGH and the frequency-division clock signal is HIGH (e.g., time t6 to t7).

In some embodiments, from time t3 to t5, the phase comparator 4 determines that the phases of the synchronization reference clock signal and the frequency-division clock signal match with each other, and outputs a high-level signal, for example. On the other hand, from time t6 to t7, since the synchronization reference clock signal is HIGH and the frequency-division clock signal is HIGH, the output of the phase comparator 4 becomes a low level.

In some embodiments, when the output of the phase comparator 4 becomes a low level, the output of the AND gate 7 (see FIG. 1) becomes a low level and the reset signal which is output from the reset signal generator 5 becomes the first logic level (time t6). As a result, the frequency division circuit 3 enters a reset state again at time t6. When the frequency division circuit 3 enters a reset state, the frequency division circuit 3 sets the frequency-division clock signal at a low level. Then, at time t8, the reset signal generator 5 sets the reset signal at the second logic level (high level), and the frequency division circuit 3 is released from a reset state. Then, the frequency division circuit 3 outputs a HIGH pulse of the frequency-division clock signal during time t9 to t10 in synchronism with timing of a change of the synchronization reference clock signal from HIGH to LOW at time t9. After time t10, until the synchronization reset signal is input or the output of the phase comparator 4 becomes LOW, the frequency division circuit 3 generates the frequency-division clock signal of a fixed frequency.

As described above, in some embodiments, by temporarily entering a reset state and then being released from a reset state, the frequency division circuit 3 can generate the frequency-division clock signal again in synchronism with the synchronization reference clock signal.

In some embodiments, the reset signal generator 5, the frequency division circuit 3, and the phase comparator 4 can be configured by arbitrarily combining a flip-flop, a logic gate circuit, and so forth, and the frequency or phase of the frequency-division clock signal may be adjusted if necessary.

As described above, in some embodiments, the phase comparator 4 monitors loss of synchronization of the frequency-division clock signal, and, if loss of synchronization is detected, after the frequency division circuit 3 is temporarily made to enter a reset state, the frequency-division clock signal is generated in synchronism with, for example, the falling edge of the next synchronization reference clock signal. As a result, even when loss of synchronization of the frequency-division clock signal occurs, synchronization can be restored quickly, and, since there is no need to interrupt the signal transmission, reliability of data transmission can be improved.

In some embodiments, since each of the plurality of transmitting circuits 2 includes the frequency division circuit 3 and has a self-synchronization restoration function by which resynchronization is achieved by automatically detecting loss of synchronization of the frequency-division clock signal at the time of generation of the frequency-division clock signal, a plurality of lanes of PCIe can be stably synchronized with each other.

A second embodiment enables a self-synchronization restoration function only with predetermined timing.

Figure 4:
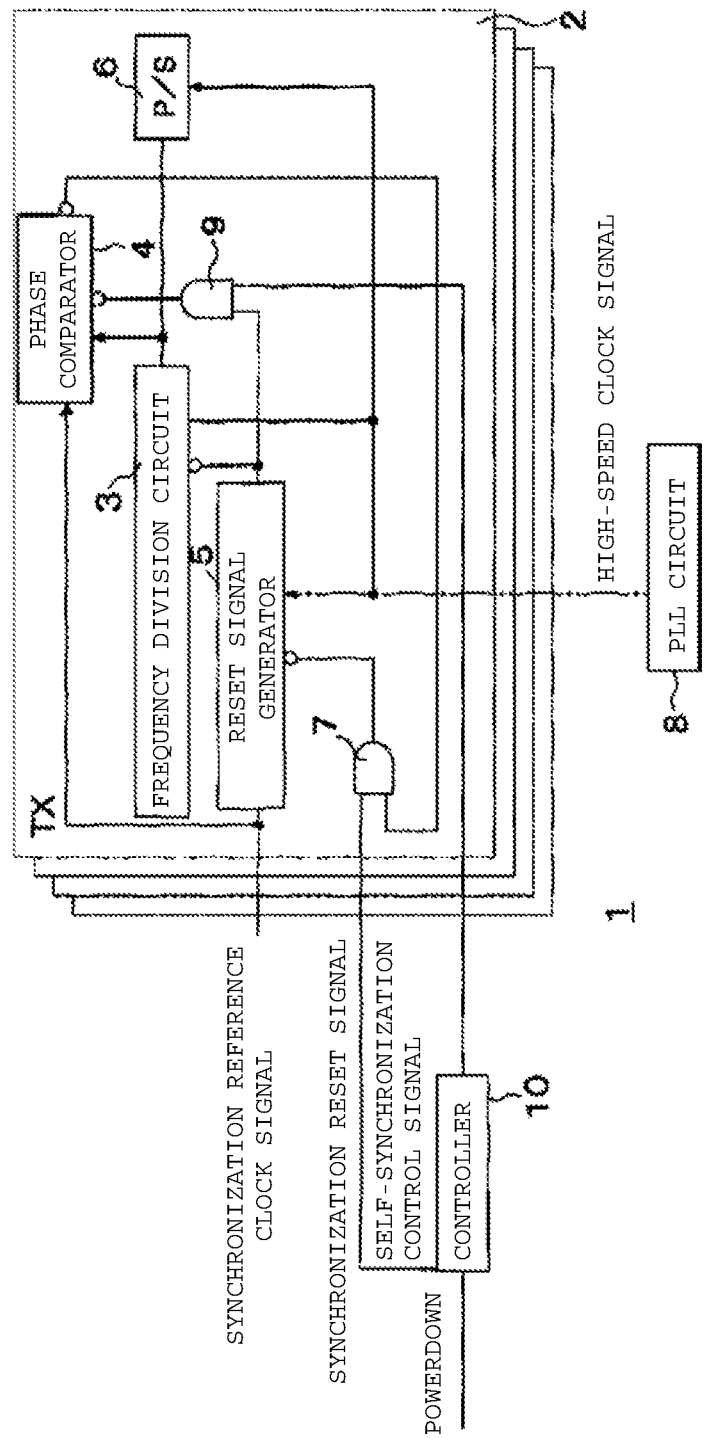
FIG. 4 is a block diagram depicting a schematic configuration of a semiconductor circuit according to a second embodiment.

FIG. 4 is a block diagram depicting the schematic configuration of a semiconductor circuit 1 according to the second embodiment. As shown in FIG. 4, the semiconductor circuit 1 may be configured by adding an AND gate (or a reset lifting controller) 9 to the semiconductor circuit 1 as shown in FIG. 1. Moreover, a self-synchronization control signal may be input from a controller 10 to the semiconductor circuit 1. The AND gate 9 may perform a logical AND operation to compute an AND value of a reset signal output from a reset signal generator 5 and the self-synchronization control signal. If an output signal of the AND gate 9 is at a low level, for example, a phase comparator 4 may enter a reset state, and, if the output signal of the AND gate 9 is at a high level, for example, the phase comparator 4 may compare the phases of a synchronization reference clock signal and a frequency-division clock signal.

In some embodiments, The self-synchronization control signal is a signal that lifts reset of the phase comparator 4 only for a predetermined period. Specifically, the self-synchronization control signal may become a predetermined logic (for example, HIGH) level only for a predetermined period in accordance with timing of the start of data transmission and lift reset of the phase comparator 4. More specifically, the self-synchronization control signal may become a predetermined logic only for a predetermined period after the start of data transmission or may become a predetermined logic only for a predetermined period from a time point immediately before the start of data transmission to a time point immediately after the start of data transmission.

In some embodiments, during a period in which the self-synchronization control signal is a predetermined logic, reset of the phase comparator 4 is lifted. Thus, the plurality of transmitting circuits 2 have a self-synchronization restoration function of restoring synchronization even when synchronization of the frequency-division clock signals is lost.

In some embodiments, reset of the phase comparator 4 is controlled by the self-synchronization control signal for the following reason. The frequency-division clock signals tend to lose synchronization immediately after a power-supply voltage is applied or immediately after the transition from a data transmission stop state to a data transmission state, and, once data transmission is smoothly performed, loss of synchronization of the frequency-division clock signal rarely occurs. For this reason, in some embodiments, in order to enable the self-synchronization restoration function only immediately after the power-supply voltage is applied or immediately after the transition from a data transmission stop state to a data transmission state, the self-synchronization control signal may be input to the semiconductor circuit 1, thereby achieving a reduction in power consumption. In some embodiments, the output signal of the phase comparator 4 is at a fixed logic level within a period in which the self-synchronization restoration function is not enabled so that the frequency division circuit 3 continuously generates the frequency-division clock signal without turning on the phase comparator 4 during such period, which can reduce power consumption in the phase comparator 4.

Figure 5:
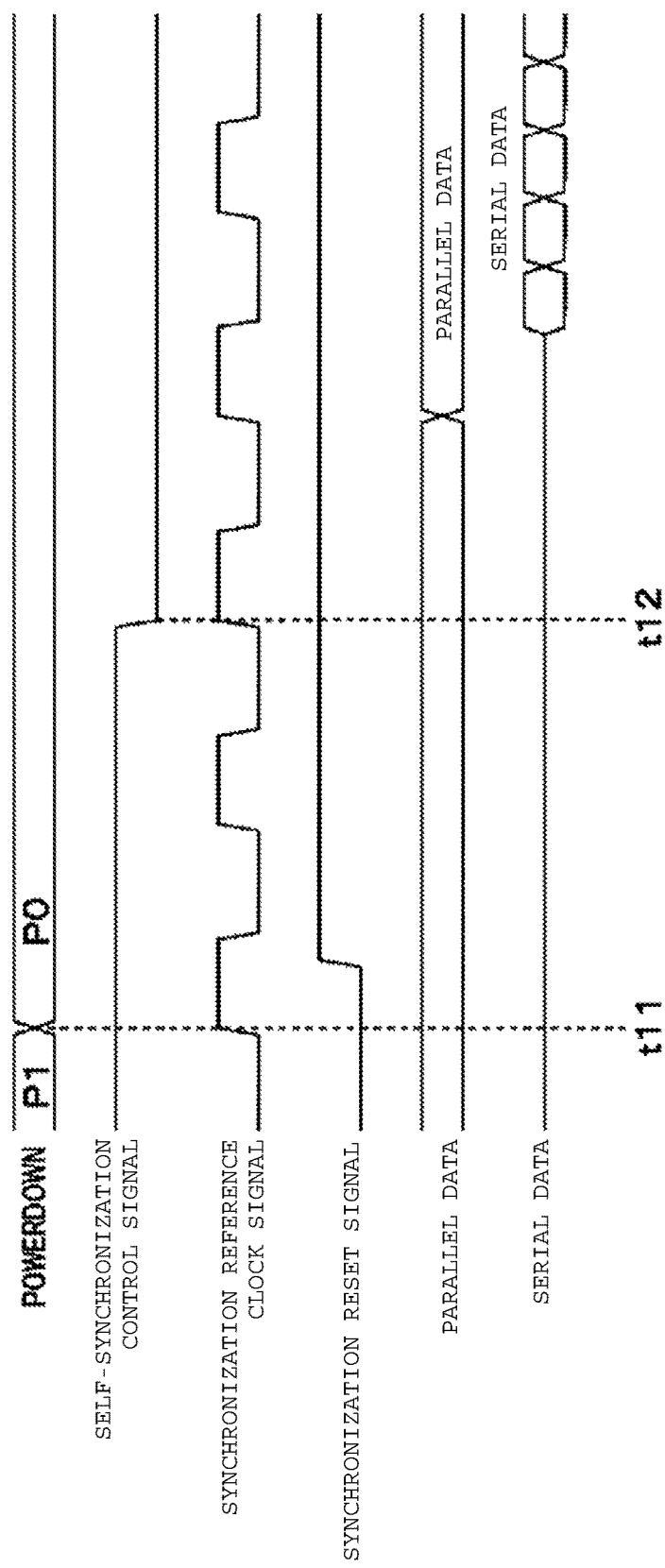
FIG. 5 is an operation timing diagram of the semiconductor circuit according to the second embodiment.

In some embodiments, to the controller 10, a POWER-DOWN signal is input. Referring to FIG. 5, this POWER-DOWN signal may be a signal indicating whether a mode is a data transmission mode (a first mode) P0 or a data transmission stop mode (a second mode) P1. The controller 10 may perform a measurement to determine whether or not a predetermined time has elapsed after the transition from the data transmission stop mode P1 to the data transmission mode P0. The controller 10 may set the self-synchronization control signal at HIGH, for example, if the predetermined time has not elapsed and may set the self-synchronization control signal at LOW, for example, after a lapse of the predetermined time.

In some embodiments, an output of the AND gate 9 becomes HIGH only when the reset signal output from the reset signal generator 5 is HIGH and the self-synchronization control signal is HIGH. The phase comparator 4 may perform a phase comparison operation only when the output of the AND gate 9 is HIGH.

FIG. 5 is an operation timing diagram of the semiconductor circuit 1 according to the second embodiment. The self-synchronization control signal becomes HIGH, for example, only for a predetermined period (until time t12) in synchronism with timing (time t11) of the transition from the data transmission stop mode P1 to the data transmission mode P0. The logic of the self-synchronization control signal may be switched depending on whether or not to perform data transmission. As described above, since whether or not to enable the above-described self-synchronization restoration function can be switched based on the logic level of the self-synchronization control signal, the logic level of the self-synchronization control signal may be switched based on, for example, sensing information of an environment sensor such as a temperature sensor. For instance, if the temperature exceeds a given threshold value or the power-supply voltage becomes smaller than or equal to a given threshold value, the self-synchronization restoration function may be enabled.

As described above, in the second embodiment, loss of synchronization of the frequency-division clock signal may be monitored by the phase comparator 4 only for a period in which loss of synchronization of the frequency-division clock signal tends to occurs (e.g., before time t12 in FIG. 5), and, if loss of synchronization occurs, the frequency division circuit 3 may be temporarily reset and resynchronization processing of the frequency-division clock signal is performed. As a result, a period in which the phase comparator 4 is operated can be shortened and power consumption can be reduced.

The above-described embodiments provide the transmitting circuit 2 of PCIe as an example; however, the semiconductor circuits 1 as illustrated FIG. 1 and FIG. 4 can also be applied to various transmission interfaces other than PCIe. Moreover, the above-described embodiments provide the self-synchronization restoration function of the frequency division circuit 3 included in the transmitting circuit 2, but the above-described embodiments can also be applied to the self-synchronization restoration function of the frequency division circuit 3 included in various circuits other than the transmitting circuit 2.

Moreover, each of the semiconductor circuits 1 according to the above-described embodiments can be incorporated into one or a plurality of semiconductor chips. In such semiconductor chip, various circuits other than the semiconductor circuits 1 according to the above-described embodiments may be implemented.

While certain embodiments have been described, these embodiments have been presented byway of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor circuit comprising:
a plurality of transmitting circuits, each transmitting circuit configured to receive a synchronized first clock signal,
wherein each of the plurality of transmitting circuits includes
a frequency division circuit configured to output a third clock signal which is generated by dividing a frequency of an unsynchronized second clock signal and is synchronized with the first clock signal,
a phase comparator configured to compare phases of the first clock signal and the third clock signal to detect a phase shift therebetween, and
a reset signal generator configured to set, when the phase shift is detected by the phase comparator, a first signal at a first logic level for a predetermined period, and
wherein the frequency division circuit is configured to enter a reset state during a period when the first signal is at the first logic level, and
wherein when the first signal changes from the first logic level to a second logic level, the frequency division circuit is released from the reset state and generates the third clock signal.

2. The semiconductor circuit according to claim 1, wherein each time the first signal changes from the first logic level to the second logic level, the frequency division circuit generates the third clock signal.

3. The semiconductor circuit according to claim 1, wherein the phase comparator is set in the reset state when the first signal becomes the first logic level.

4. The semiconductor circuit according to claim 1,
wherein each of the plurality of transmitting circuits is configured to receive a synchronized second signal, and
wherein the reset signal generator sets the first signal at the first logic level in at least one of a case in which the second signal is at a predetermined logic level or a case in which the phase comparator detects the phase shift.

5. The semiconductor circuit according to claim 4, further comprising a first AND gate,
wherein the reset signal generator includes a terminal, to which an output signal of the first AND gate is input.

6. The semiconductor circuit according to claim 5, wherein the first AND gate is configured to perform a logical AND operation to compute an AND value of the second signal and an output signal of the phase comparator.

7. The semiconductor circuit according to claim 1, wherein it is detected, based on a logic level of a signal output from the phase comparator, whether or not the phases of the first clock signal and the third clock signal are shifted.

8. The semiconductor circuit according to claim 1, wherein each of the plurality of transmitting circuit has a first mode in which data transmission is performed and a second mode in which data transmission is stopped, and wherein the semiconductor circuit further comprises:

a reset lifting controller configured to release the phase comparator from a reset state for a predetermined period at a time of transition from the second mode to the first mode.

9. The semiconductor circuit according to claim 8, wherein the reset lifting controller performs control to cause the phase comparator to enter a reset state or not based on the first signal and a third signal that becomes a predetermined logic level for the predetermined period.

10. The semiconductor circuit according to claim 9, wherein the reset lifting controller comprises a second AND gate, and wherein the second AND gate is configured to perform a logical AND operation to compute an AND value of a signal output from the reset signal generator and the third signal.

11. The semiconductor circuit according to claim 10, wherein when an output signal of the second AND gate is at the first logic level, the phase comparator is configured to enter the reset state, and when the output signal of the second AND gate is at the second logic level, the phase comparator is configured to compare the phases of the first clock signal and the third clock signal.

12. The semiconductor circuit according to claim 9, further comprising a controller configured to input a fourth signal indicating whether a mode is the first mode or the second mode.

13. The semiconductor circuit according to claim 12, wherein the controller is further configured to perform a measurement to determine whether or not the predetermined period has elapsed after the transition from the second mode to the first mode.

14. The semiconductor circuit according to claim 13, wherein The controller is further configured to set, when the predetermined period has not elapsed, the third signal at the second logic level, and set, after a lapse of the predetermined period, the third signal at the first logic level.

15. A method of restoring synchronization in a semiconductor circuit comprising a plurality of transmitting circuits, the method comprising:

receiving, by each of the plurality of transmitting circuits, a synchronized first clock signal;

generating, by one of the plurality of transmitting circuits, a third clock signal by dividing a frequency of an unsynchronized second clock signal, the third clock signal being synchronized with the first clock signal;

outputting, by the one transmitting circuit, the third clock signal that is generated;

comparing, by a phase comparator of the one transmitting circuit, phases of the first clock signal and the third clock signal to detect a phase shift therebetween;

setting, by a reset signal generator of the one transmitting circuit and when the phase shift is detected by the phase comparator, a first signal at a first logic level for a predetermined period;

causing the frequency division circuit to enter a reset state during a period when the first signal is at the first logic level; and releasing, when the first signal changes from the first logic level to a second logic level, the frequency division circuit from the reset state and generating the third clock signal synchronized with the first clock signal.

16. The method according to claim 15, further comprising:

each time the first signal changes from the first logic level to the second logic level, generating by the frequency division circuit, the third clock signal.

17. The method according to claim 15, further comprising:

setting the phase comparator in the reset state when the first signal becomes the first logic level.

18. The method according to claim 15, further comprising:

receiving, by each of the plurality of transmitting circuits, a synchronized second signal, and setting, by the reset signal generator, the first signal at the first logic level in at least one of a case in which the second signal is at a predetermined logic level or a case in which the phase shift is detected.

19. The method according to claim 18, further comprising:

inputting an output signal of a first AND gate of the semiconductor circuit to a terminal of the reset signal generator.

20. The method according to claim 19, further comprising:

performing, by the first AND gate, a logical AND operation to compute an AND value of the second signal and an output signal of the phase comparator.

* * * * *